United States Patent
Nakamata et al.

(10) Patent No.: US 10,106,683 B2
(45) Date of Patent: Oct. 23, 2018

(54) RESIN COMPOSITE, SEMICONDUCTOR DEVICE, AND METHOD OF MANUFACTURING THE SEMICONDUCTOR DEVICE

(71) Applicant: FUJI ELECTRIC CO., LTD., Kawasaki-shi, Kanagawa (JP)

(72) Inventors: Yuko Nakamata, Matsumoto (JP); Yuji Ichimura, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/397,648

(22) Filed: Jan. 3, 2017

(65) Prior Publication Data

US 2017/0240744 A1 Aug. 24, 2017

(30) Foreign Application Priority Data

Feb. 18, 2016 (JP) ................. 2016-028703

(51) Int. Cl.
| | |
|---|---|
| H01L 23/48 | (2006.01) |
| C08L 79/08 | (2006.01) |
| C08L 63/00 | (2006.01) |
| H01L 21/56 | (2006.01) |
| H01L 23/29 | (2006.01) |
| H01L 23/31 | (2006.01) |

(52) U.S. Cl.
CPC ............. C08L 79/085 (2013.01); C08L 63/00 (2013.01); H01L 21/56 (2013.01); H01L 23/293 (2013.01); H01L 23/3121 (2013.01); C08L 2203/206 (2013.01)

(58) Field of Classification Search
CPC ... H01L 23/3121; H01L 23/293; H01L 21/56; C08L 63/00
See application file for complete search history.

(56) References Cited

U.S. PATENT DOCUMENTS

| | | | |
|---|---|---|---|
| 2013/0026660 A1 | 1/2013 | Czubarow et al. | |
| 2017/0217127 A1* | 8/2017 | Kobayashi | ............... B32B 5/24 |

FOREIGN PATENT DOCUMENTS

| | | |
|---|---|---|
| JP | 2013-127022 A | 6/2013 |
| JP | 2014-521754 A | 8/2014 |

* cited by examiner

*Primary Examiner* — (Vikki) Hoa B Trinh
(74) *Attorney, Agent, or Firm* — Rabin & Berdo, P.C.

(57) ABSTRACT

A resin composite includes a maleimide resin powder and a resin having a glass transition point that is lower that the glass transition point of the maleimide resin. The resin having a glass transition point that is lower than that of the maleimide resin may be an epoxy resin. Then, the resin composite may be cured at the curing temperature of the epoxy resin. The maleimide resin powder is mixed in an amount ranging from 50 weight % to 80 weight % with respect to the epoxy resin.

9 Claims, 3 Drawing Sheets

FIG.1

|  | EXAMPLE 1 | EXAMPLE 2 | EXAMPLE 3 | EXAMPLE 4 | EXAMPLE 5 | EXAMPLE 6 | COMPARISON EXAMPLE |
|---|---|---|---|---|---|---|---|
| MI CONCENTRATION IN RESIN wt% | 50 | 75 | 65 | 80 | 5 | 97 | 0 |
| FLAME RETARDANT ADDITION | NO | NO | NO | NO | NO | NO | YES (ALUMINUM HYDROXIDE) |
| Tg (°C) | 198 | 220 | 208 | 230 | 188 | 269 | 182 |
| NON-COMBUSTIBILITY (V-0) | GOOD | GOOD | GOOD | GOOD | POOR | GOOD | GOOD |
| WORKABILITY (VISCOSITY/Pa·s) | GOOD (11) | GOOD (18) | GOOD (16) | GOOD (20) | GOOD (9) | POOR (80) | GOOD (8) |
| HEAT CYCLE>500cyc | GOOD | GOOD | GOOD | GOOD | GOOD | GOOD | POOR |

RESIN COMPOSITE, SEMICONDUCTOR DEVICE, AND METHOD OF MANUFACTURING THE SEMICONDUCTOR DEVICE

CROSS REFERENCE TO RELATED APPLICATIONS

This application is based upon and claims the benefit of priority of the prior Japanese Patent Application No. 2016-028703, filed on Feb. 18, 2016, the entire contents of which are incorporated herein by reference.

BACKGROUND OF THE INVENTION

1. Field of the Invention

The embodiments discussed herein are related to a resin composite, a semiconductor device, and a method of manufacturing a semiconductor device.

2. Description of the Related Art

Recently, centered around insulated gate bipolar transistors (IGBTs), power modules have come to be widely used in power conversion equipment. A power module has one or more power semiconductor chips built in, configures a portion of or an entire conversion connection, and is a power semiconductor device having a structure electrically insulated between the power semiconductor chip and, a base plate or cooling surface.

FIG. 3 is a cross-sectional view of a semiconductor package. As depicted in FIG. 3, the semiconductor package includes a power semiconductor chip 1, a stacked substrate 2, a metal substrate 3, a terminal case 4, a metal terminal 5, a metal wire 6, a cover 7, and a thermosetting resin 8. The power semiconductor chip 1 is a power semiconductor chip such as an IGBT, a diode, or the like and is mounted on the stacked substrate 2. The stacked substrate 2 includes a conducting plate 22 such as copper on a front surface and a rear surface of an insulating substrate 21 such as a ceramic substrate. The stacked substrate 2 is solder-joined to the metal substrate 3. The terminal case 4 is bonded to the metal substrate 3. The terminal case 4 is made of a thermoplastic resin such as Poly Phenylene Sulfide (PPS) and is insert-molded to fix the metal terminal 5 that carries out signals. The metal terminal 5 is fixed on the stacked substrate 2 by soldering and passes through the cover 7 to protrude to the exterior. The metal wire 6 electrically connects the power semiconductor chip 1 and the metal terminal 5. The cover 7 is formed of the same thermoplastic resin as terminal case 4. The terminal case 4 is filled with the thermosetting resin 8 as a sealing material that insulates and protects along surfaces of the stacked substrate 2 and the power semiconductor chip 1 on a substrate on which a power chip is mounted.

Usually, an epoxy resin is used as the thermosetting resin 8. The epoxy resin is suitable as a sealing material that is dimensionally stable, water resistant, chemical resistant, and has a high electrical insulating property.

Nonetheless, accompanying practical uses of next generation semiconductor materials such as silicon carbide (SiC), power semiconductor chips of higher breakdown voltages are appearing. For example, with conventional silicon (Si), the breakdown voltage is about 1200V whereas with silicon carbide, the breakdown voltage reaches 3300V, 13 kV. Since breakdown voltages are becoming higher, the temperatures of sealing materials that seal chips and elements are progressively becoming higher. Therefore, high heat resistance of sealing materials is demanded and further enhancement of the heat resistance of conventional epoxy resins has become difficult. To realize high heat resistance, there is a technique of using, as a sealing material, a resin that is a compound of an epoxy resin and a maleimide resin, which is a high-heat resistant resin (for example, refer to Published Japanese-Translation of PCT Application, Publication No. 2014-521754 and Japanese Patent Application No. 2013-127022).

SUMMARY OF THE INVENTION

According to one aspect of the present invention, a resin composite includes a maleimide resin powder; and a resin having a glass transition point that is lower than that of the maleimide resin powder.

In the resin composite, the resin is an epoxy resin.

The resin composite is cured at a curing temperature for the epoxy resin.

In the resin composite, the maleimide resin powder is mixed in an amount of 50 weight % to 80 weight % with respect to the epoxy resin.

In the resin composite, the maleimide resin powder is a maleimide resin having a hydroxy group.

A semiconductor device according to another aspect of the invention includes a stacked substrate on which a semiconductor chip is mounted; and a thermosetting resin surrounding the stacked substrate. The thermosetting resin is formed by a resin composite including a maleimide resin powder and a resin having a glass transition point that is lower than that of the maleimide resin power.

In the semiconductor device, the resin is an epoxy resin. The thermosetting resin is cured by curing the resin composite at a curing temperature for the epoxy resin.

A method of manufacturing a semiconductor device according to another aspect of the invention includes mixing a maleimide resin powder and a resin having a glass transition point that is lower than that of the maleimide resin powder; surrounding a stacked substrate by the resin mixed with the maleimide resin powder, the stacked substrate having a semiconductor chip mounted thereon; and curing the resin mixed with the maleimide resin powder and surrounding the stacked substrate at a temperature of a glass transition point that is lower than that of the maleimide resin powder.

In the method of manufacturing a semiconductor device, the resin is an epoxy resin.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 1 is a chart depicting evaluation results and resin composition ratios of examples and a comparison example;

DETAILED DESCRIPTION OF THE INVENTION

Figure 2:
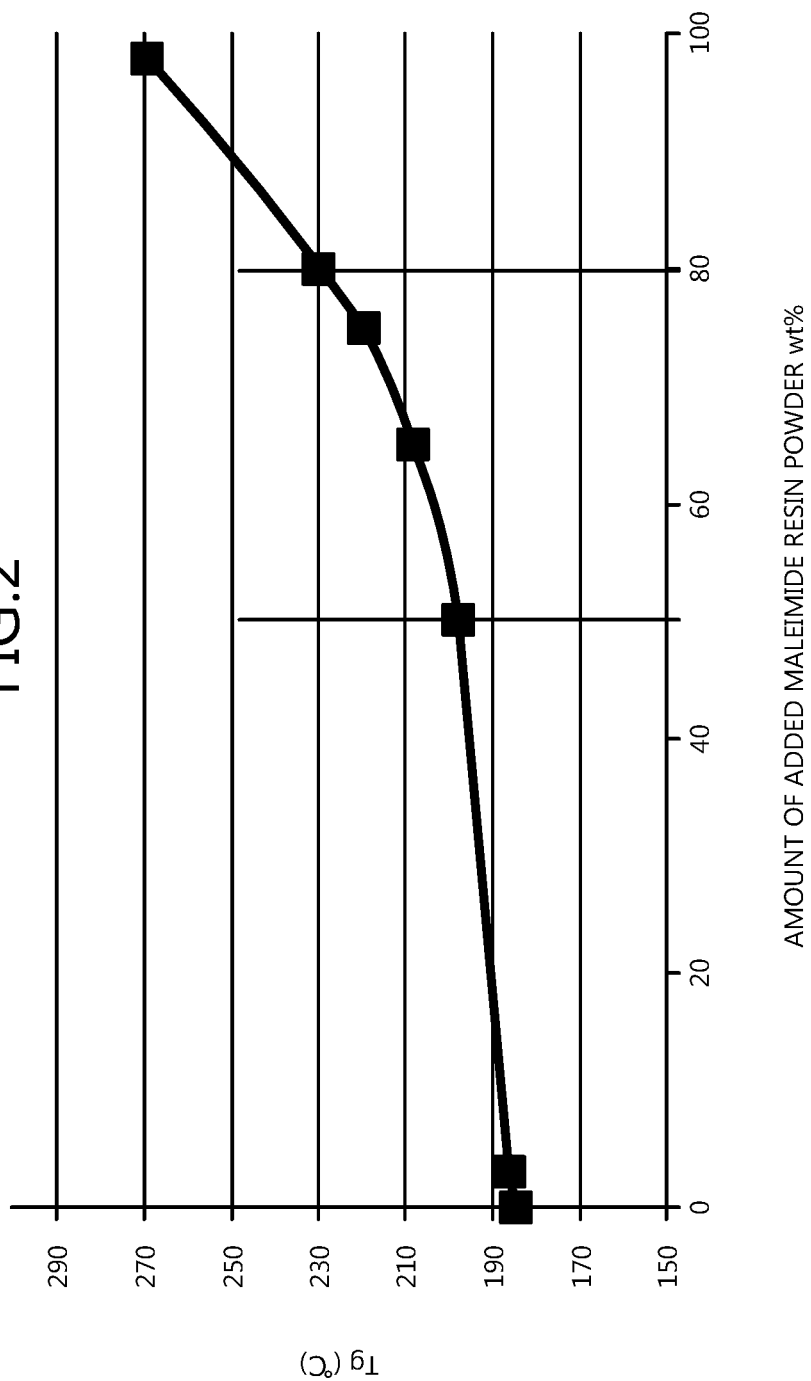
FIG. 2 is a diagram depicting a relationship of a concentration of the maleimide resin powder in a resin and glass transition temperature.

Embodiments of a resin composite, a semiconductor device, and a method of manufacturing a semiconductor device according to the present invention will be described in detail with reference to the accompanying drawings. The inventors, as a result of earnest research, found that a resin composite (before curing) of a maleimide resin powder (solid) mixed with an epoxy resin (liquid) enables a curing temperature about the same as that of the epoxy resin and causes the heat resistance to be enhanced exceeding that of the epoxy resin.

When a maleimide resin powder is combined with a resin having a lower glass transition point than the maleimide resin such as, for example, an epoxy resin, curing is not necessary since the maleimide resin powder is a solid. Thus, a resin composite of a maleimide resin powder combined with a resin having a low glass transition point enables curing at the curing temperature of the resin having the low glass transition point. A resin mixed with maleimide resin powder is called a matrix resin. When a mixed resin composite of a maleimide resin powder mixed with an epoxy resin is cured at the curing temperature of the epoxy resin having a low glass transition point, the glass transition point of the mixed resin composite was found to rise. Since the glass transition point rises, the heat resistance of the resin composite increases. The mixed and cured resin composite has a structure in which maleimide resin particles are dispersed in the matrix resin. Use of the mixed resin composite as a sealing material of a semiconductor package enables the heat resistance to be improved. Further, since curing is possible at the curing temperature of the resin having a low glass transition point, the curing temperature is not a high temperature. Therefore, the occurrence of voids and oxide films in the sealing material may be suppressed.

The mechanism of the glass transition point rising is not absolutely clear, however, the epoxy resin reacts and solidifies on the surface of the dispersed maleimide resin particles, whereby the glass transition point is thought to increase.

The resin composite contacts a metal member of the semiconductor device and is stacked on the metal member. The resin composite is preferably a thermosetting resin. The resin composite used as a sealing material includes a maleimide resin powder, a matrix resin, an inorganic filler material, and a curing agent, and may include a curing accelerator and a chelating agent.

An epoxy resin, a phenolic resin, a urea resin, an unsaturated polyester resin, a melamine resin, etc. having a lower glass transition point than the maleimide resin may be used as the matrix resin. Among these, use of an epoxy resin as the matrix resin is preferable. As the epoxy resin, use of an epoxy resin having at least two or more epoxy groups in one molecule is preferable and bisphenol AD, bisphenol F, allyl-group-introduced bisphenol A resin, phenol novolak epoxy resin, cresol novolak epoxy resin, polyfunctional epoxy resin, alicyclic epoxy resin may be given as examples, however, the epoxy resin is not limited hereto. The epoxy resin may be used independently or may be a mixture of two or more types. The glass transition temperatures of these resins is from 100 degrees C. to 190 degrees C., and the glass transition temperature of a mixed resin of an alicyclic epoxy resin and a bisphenol A resin is 185 degrees C.

The terminal of the maleimide resin is terminated by a hydrogen (H) atom, or a hydroxy group or hydrogen atom via an aromatic chromophore. This aromatic chromophore is a divalent aromatic hydrocarbon group (aryl group (Ar—)) having a carbon atom count of 6 or more and 20 or less, and may be unsubstituted (no functional group) or may be substituted. An aryl substituent is, for example, a phenylene group ($—C_6H_4$), etc. substituted with a linear or branched alkyl group having a carbon atom count of 1 or more and 6 or less (preferably, a methyl group ($—CH_3$) or an ethyl group ($—CH_2CH_3$)). Further, there is mono maleimide having one five-membered ring of maleimide and bismaleimide having two five-membered rings of maleimide. As a mono maleimide resin having no hydroxy group, N-phenylmaleimide(MPi), N-(2-methylphenyl)maleimide, etc. may be given as examples. As a mono maleimide resin having a hydroxy group, N-phenyl(4-hydroxy)-maleimide, N-(2-methyl-4-hydroxyphenyl)-maleimide, etc. may be given as examples. Further, as a bismaleimide, N,N'-phenylenebismaleimide, N,N'-hexamethylene bismaleimide, etc. may be given as examples. The glass transition temperatures of these resins are from 200 degrees C. to 300 degrees C., and the glass transition temperature of N-phenyl maleimide resin is 270 degrees C.

As the curing agent, an amine curing agent, for example, aliphatic diamine, aliphatic polyamine, aromatic amine, cyclic amine, imidazole curing agents, acid anhydride curing agents, for example, aliphatic acid anhydride, alicyclic acid anhydride, aromatic acid anhydride, polymercaptan curing agents, for example, liquid polymercaptan, polysulfide resin, etc. are available and may be used independently, or two or more types may be mixed and used, however, the curing agent is not limited hereto. Further, when acid anhydride is used as the curing agent, since the curing reaction does not occur easily with the curing agent alone, an amine may be added as a curing accelerator. As examples of curing accelerators, a tertiary amine(benzyl dimethyl amine, triethylenediamine), imidazole(2-methylimidazole, 2-ethyl 4-methyl imidazole) may be given, however, the curing accelerator is not limited hereto.

As a chelating agent, one of an aluminum-based chelating agent, a titanium-based chelating agent, and a zirconium-based chelating agent, or two or more thereof may be mixed and used. Therefore, for example, among aluminum-based chelating agents, two or more different types may be used together, or an aluminum-based chelating agent and a titanium-based chelating agent may be used together. As the aluminum-based chelating agent, for example, aluminum ethyl acetoacetate·di-isopropylate (ALCH), aluminum tris ethylacetoacetate (ALCH-TR), aluminum alkyl acetoacetate·di-isopropylate, aluminum bis ethylacetoacetate·monoacetylacetonate, aluminum tris acetylacetonate, etc. may be used, however, the aluminum-based chelating agent is not limited hereto. Such an aluminum-based chelating agent is commercially available from Kawaken Fine Chemicals, Co., Ltd. and may be suitably used. As the titanium-based chelating agent, for example, titanium acetylacetonate (TC-100), titanium tetra acetylacetonate (TC-401), titanium ethyl acetoacetate (TC-710), etc. may be used, however, the titanium-based chelating agent is not limited hereto. As the zirconium-based chelating agent, for example, zirconium tetra acetylacetonate (ZC-150), zirconium monoacetylacetonate (ZC-540), etc. may be used, however, the titanium-based chelating agent is not limited hereto. The titanium-based chelating agents and zirconium-based chelating agents given as examples are commercially available from Matsumoto Fine Chemicals, Co., Ltd. and may be suitably used. The chelating agent may be suitably selected from among aluminum-based chelating agents, titanium-based chelating agents, and zirconium-based chelating agents, regardless of the element forming the metal member.

A microfiller or nanofiller formed from inorganic particles such as silica, alumina, boron nitride, aluminum nitride, etc. may be included as the inorganic filler material, for example. When the inorganic filler material is a microfiller and the total mass of the thermosetting resin, which is the base resin, and the curing agent is 100 parts by weight, the contained inorganic filler material is preferably 100 to 600 parts by weight, and is more preferably 200 to 400 parts by weight. The particle size of the microfiller is a few μm to a few hundred μm. Further, when the inorganic filler material is a nanofiller and the total mass of the thermosetting resin, which is the base resin, and the curing agent is 100 parts by weight, the contained inorganic filler material is preferably 10 to 300 parts by weight and more preferably 20 to 200 parts by weight. The thermosetting resin, which is the base resin, is the total mass of the matrix resin and the maleimide powder.

The metal member of the semiconductor is bonding wire, a conductive substrate of the stacked substrate, a metal terminal, etc.

Figure 3:
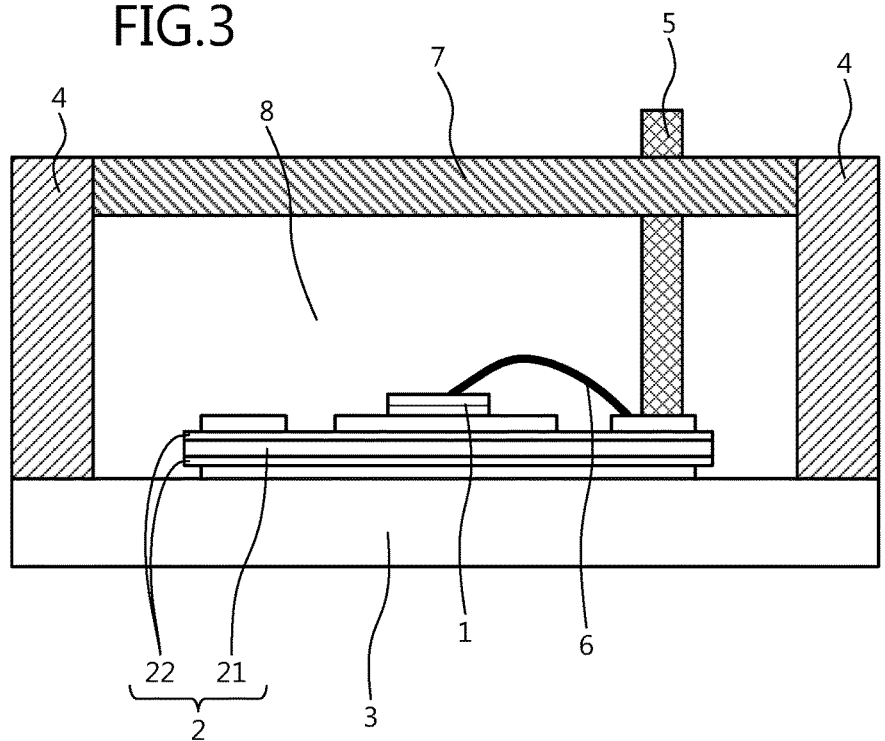
FIG. 3 is a cross-sectional view of a semiconductor package.

The present invention, according to an embodiment, is related to a semiconductor device that includes the previously described thermosetting resin mold as a component and is sealed by the thermosetting resin. In FIG. 3, a conceptual cross-sectional view of a semiconductor device according to the present embodiment is depicted. The semiconductor device may be a power module used in applications where high electrical current is applied, however, the semiconductor device is not limited hereto.

FIG. 3 is a cross-sectional view of the semiconductor package. In the semiconductor package, the conducting plate 22 containing copper, etc., on a bottom surface, which is a first surface of the insulating substrate 21, and the conducting plate 22 containing copper, on a top surface, which is a second surface of the insulating substrate 21 are arranged and form the stacked substrate 2. On the conducting plates 22 of the stacked substrate 2, the power semiconductor chip 1 is mounted and attached via a non-depicted conductive junction layer. Further, the metal wire 6 is arranged on the top surface of the power semiconductor chip 1. In place of the metal wire 6, a metal terminal may be joined via the non-depicted conductive junction layer. Further, by the non-depicted conductive junction layer, an implant scheme printed board having the metal terminal (implant pin) may be attached. The surfaces of these members are covered by the thermosetting resin 8. In the present invention, the top surface and the bottom surface, for the purposes of description, are relative terms specifying up and down in the drawing and does not limit up and down by a relation with an aspect of utilization of the semiconductor package.

In the method of manufacturing such a semiconductor package, according to a conventional technique, the power semiconductor chip 1 is mounted on the stacked substrate 2, and the metal wire 6 and the metal terminal 5 are attached. Further, in place of the metal wire 6, a metal terminal may be joined. Thereafter, these components are injected with a resin composite (before curing) containing a maleimide resin powder. Alternatively, only on the surface of desired metal member, using a brush or dropper, the resin composite before curing and containing the maleimide resin powder may be applied. This is cured under predetermined conditions, enabling manufacture of the semiconductor package by the embodiment of the present invention. As another aspect, for example, in the semiconductor device including a metal lead frame, a thermosetting resin layer is preferably stacked on a surface of the lead frame.

Hereinafter, examples will be described. FIG. 1 is a chart depicting evaluation results and resin composition ratios of the examples and a comparison example. In the examples and the comparison example, a Pelnox Limited mixture ME272 of a bisphenol A epoxy resin and an alicyclic epoxy resin was used as the epoxy resin, while a Pelnox Limited hexahydrophthalicacid anhydridecyclohexane-1, 2-dicarboxylicacid anhydride HV136 was used as the curing agent to form the basic composition of the resin. Further, the maleimide resin was N-phenyl(4-hydroxy)-maleimide resin having a hydroxy group. Powdered maleimide resin and epoxy resin were mixed at the mixing ratios depicted in FIG. 1 so that the average particle size became 20 μm. Further, as the curing agent, acid anhydride was used to become 100 part by weight with respect to the thermoplastic resin at 100 parts by weight. As the inorganic filler material, fused silica particles having an average particle size of 5 μm (Tatsumori Limited, product name "ZA-30") were used. The added amount was formulated so that 250 parts by weight was achieved when the total mass of the thermoplastic resin and the curing agent was 100 parts by weight. The thermoplastic resin is a mixture of a maleimide powder to an epoxy resin. After these were mixed and maintained at 100 degrees C. for one hour, under the condition of maintaining 180 degrees C. for one hour 1, these were heated and cured, creating the resin composite. At this time, the curing temperature was 180 degrees C., the same as that in a case of the epoxy resin alone. The glass transition point, non-combustibility, workability, and heat cycle were evaluated. The particle size of the maleimide resin powder is preferably 10 to 200 μm from a point of dispersion to the matrix resin. Further, when the particle size is less than 10 μm, handling such as scattering becomes difficult and dispersion becomes poor.

The mixing ratio of the maleimide powder is depicted as the MI concentration in resin in FIG. 1. The MI concentration in resin is indicated as weight %, as the concentration of the maleimide resinpowder in the resin obtained by mixing the maleimide resinpowder with the epoxy resin. This is a case where the total amount of the epoxy resin and the maleimide resin powder is assumed to be 100 weight %. Flame retardant addition in FIG. 1 indicates whether flame retardant was added. Further, Tg is the glass transition point, in units of degrees C.

Here, non-combustibility is a property required for use of the semiconductor package at high temperatures. Conventionally, a flame retardant is added to sealing resin for semiconductors, such as an epoxy resin. In general, as a flame retardant constituent, bromine (Br) based, aluminum hydroxide $(Al(OH)_3)$ based, magnesium hydroxide $(Mg(OH)_2)$ based, phosphorous (P) based, silicon based, nitrogen (N) based non-combustible matter, etc. is added to the sealing resin. However, by the addition of these flame retardants, a problem arises in that the heat resistance of the sealing resin decreases.

On the other hand, although a resin having a non-combustible skeleton and imparting the property of non-combustibility to the sealing resin exists without the addition of a flame retardant, such a resin is extremely costly at present. Moreover, since such a resin is a high polymer and cast molding is difficult, transfer molding is used. However, transfer molding is limited in terms of the size that can be molded. Therefore, without the addition of a flame retardant, there is further no use of a resin having a non-combustible skeleton, and a non-combustible resin is demanded. Thus, in the examples and the comparison example, non-combustibility was also evaluated.

In particular, non-combustibility was evaluated by a plastic material flammability test based on Standard 94 of the Underwriters Laboratories(UL), a standard representing the degree of resistance to flammability of a material. In FIG. 1, when a V-0 determination criterion in the UL Standard 94 is satisfied, non-combustibility was evaluated to be "good" and when not satisfied, non-combustibility was evaluated to be "poor".

Further, workability indicates whether the resin is easily cast in the terminal case when the semiconductor package is created. When the viscosity of the resin is high, casting in the terminal case becomes difficult, the burden of the work increases and since the number of man-hours for creating the semiconductor package increases, and it is not desirable. Therefore, in the examples and in the comparison example, workability was also evaluated.

In particular, workability was evaluated by the viscosity of the resin. For example, when the viscosity of the resin at 25 degrees C. is 40 Pa·a or less, workability becomes favorable and therefore, workability was evaluated as "good" and when the viscosity exceeds 40 Pa·a, workability becomes poor and therefore, workability was evaluated as "poor". The viscosity was measured based on JIS Z8803, using a single cylinder rotary viscosity meter.

Further, heat resistance was evaluated by a heat cycle test of the semiconductor device package using the resin composite depicted in FIG. 1. In particular, the heat cycle involved maintaining a temperature of −40 degrees C. for 30 minutes and a temperature of 175 degrees C. for 30 thereafter, repeated 500 times, and when there was no separation of the chip and sealing resin, the heat cycle was evaluated as "good" and when the chip and the sealing resin separated before reaching 500 repetitions, the heat cycle was evaluated as "poor". Separation was confirmed visually and by an optical microscope at a magnification of 500 times.

Example 1 is an example in which the epoxy resin was 50 weight %, the maleimide resin powder was 50 weight %, i.e., the concentration of the maleimide resin powder in the resin obtained by mixing the maleimide resin powder with the epoxy resin was 50 weight %, and no flame retardant was added. In example 1, the glass transition point was 198 degrees C., the non-combustibility satisfied the V-0 determination criterion, the workability was favorable since the viscosity of the resin was low, and heat cycle reached 500 repetitions. In this manner, when the concentration of the maleimide resin powder in the resin is set to be 50 weight %, the glass transition point becomes higher, whereby the heat resistance rises. Further, the viscosity of the resin was low and there was no problem with workability and even when no flame retardant was added, non-combustibility was realized.

Example 2 is an example in which the epoxy resin was 25 weight %, the maleimide resin powder was 75 weight %, i.e., the concentration of the maleimide resin powder in the resin obtained by mixing the maleimide resin powder with the epoxy resin was 75 weight %, and no flame retardant was added. In example 2, the glass transition point was 220 degrees C., the non-combustibility satisfied the V-0 determination criterion, the workability was favorable since the viscosity of the resin was low, and the heat cycle reached 500 repetitions. In example 2, the concentration of the maleimide resin powder in the resin was higher in than example 1, the glass transition point also became higher. In this manner, when the concentration of the maleimide resin powder in the resin is set to be 75 weight %, the glass transition point becomes higher, whereby the heat resistance rises. Further, although the viscosity of the resin was higher than in example 1, there was no problem with workability and even when no flame retardant was added, the required non-combustibility was realized.

Example 3 is an example in which the epoxy resin was 35 weight %, the maleimide resin powder was 65 weight %, i.e., the concentration of the maleimide resin powder in the resin obtained by mixing the maleimide resin powder with the epoxy resin was 65 weight %, and no flame retardant was added. In example 3, the glass transition point was 208 degrees C., the non-combustibility satisfied the V-0 determination criterion, the workability was favorable since the viscosity of the resin was low, and the heat cycle reached 500 repetitions. In example 3, since the concentration of the maleimide resin powder in the resin was between those in example 1 and example 2, the glass transition point and the viscosity were also between those of example 1 and example 2. In this manner, when the concentration of the maleimide resin powder in the resin is set to be 65 weight %, the glass transition point becomes higher, whereby the heat resistance rises. Further, since the viscosity of the resin was low, there was no problem with workability and even when no flame retardant was added, the required non-combustibility was realized.

Example 4 is an example in which the epoxy resin was 20 weight %, the maleimide resin powder was 80 weight %, i.e., the concentration of the maleimide resin powder in the resin obtained by mixing the maleimide resin powder with the epoxy resin was 80 weight %, and no flame retardant was added. In example 4, the glass transition point was 230 degrees C., the non-combustability satisfied the V-0 determination criterion, the workability was favorable since the viscosity of the resin was low, and the heat cycle reached 500 repetitions. In example 4, since the concentration of the maleimide resin powder in the resin was higher than that in example 2, the glass transition point was also higher as was the viscosity. In this manner, when the concentration of the maleimide resin powder in the resin is set to be 80 weight %, the glass transition point becomes higher, whereby the heat resistance rises. Further, since the viscosity of the resin was low, there was no problem with workability and even when no flame retardant was added, the required non-combustibility was realized.

Example 5 is an example in which the epoxy resin was 95 weight %, the maleimide resin powder was 5 weight %, i.e., the concentration of the maleimide resin powder in the resin obtained by mixing the maleimide resin powder with the epoxy resin was 5 weight %, and no flame retardant was added. In example 5, the glass transition point was 188 degrees C., the non-combustibility did not satisfy the V-0 determination criterion, the workability was favorable since the viscosity of the resin was low, and the heat cycle reached 500 repetitions. In example 5, the concentration of the maleimide resin powder in the resin was lower than that in example 1 and therefore, compared to example 4, the glass transition point became lower, and the heat cycle reached 500 repetitions. In this manner, when the concentration of the maleimide resin powder in the resin is set to be 5 weight %, the glass transition point becomes higher, whereby the heat resistance rises. Further, the viscosity of the resin was low, and there was no problem with workability. However, in example 5, since the concentration of the maleimide resin powder in the resin was low, the required non-combustibility was not realized.

Example 6 is an example in which the epoxy resin was 3 weight %, the maleimide resin powder was 97 weight %, i.e., the concentration of the maleimide resin powder in the resin obtained by mixing the maleimide resin powder with the epoxy resin was 97 weight %, and no flame retardant was added. In example 6, the glass transition point was 269 degrees C., the non-combustibility satisfied the V-0 determination criterion, the workability was poor since the viscosity of the resin was high, and the heat cycle reached 500 repetitions. In example 6, the concentration of the maleimide resin powder in the resin was higher than that in example 4, whereby the glass transition point was also higher, and the heat cycle reached 500 repetitions. However, in example 6, since the viscosity of the resin was high, there was a problem with workability.

The comparison example is an example in which the epoxy resin was 100 weight %, the maleimide resin powder was 0 weight %, i.e., the maleimide resin powder was not added, and aluminum hydroxide was added as flame retardant. In the comparison example, the glass transition point was 182 degrees C., the non-combustibility satisfied the V-0 determination criterion, the workability was favorable since the viscosity of the resin low, but the heat cycle did not reach 500 repetitions. In the comparison example, since the flame retardant was added, the non-combustibility was satisfied. However, in the comparison example, since the maleimide resin powder is not added, the glass transition point is low, and the heat resistance was insufficient.

In this manner, from examples 1 to 6 in FIG. 1, the resin obtained by mixing the maleimide resin powder with the epoxy resin was found to have heat resistance properties.

FIG. 2 is a diagram depicting the relationship of the concentration of the maleimide resin powder in the resin and glass transition temperature. The concentration of the maleimide resin powder in the resin is the concentration of the maleimide resin powder in the resin obtained by mixing the maleimide resin powder with the epoxy resin. FIG. 2 is a graph of the glass transition points and concentrations of the maleimide in the resin of examples 1 to 6 and the comparison example in FIG. 1. From the graph in FIG. 2, it is known that when the concentration of the maleimide resin powder in the resin increases, the glass transition point rises. Further, from the graph in FIG. 2, it is known that while the concentration of the maleimide resin powder is low, for example, 0 to 50 weight %, the glass transition point gradually rises, and when the concentration of the maleimide resin powder becomes high, for example, 50 weight % or greater, the glass transition point rises sharply.

Here, the heat cycle is performed at 175 degrees C. and therefore, the glass transition point has to be higher than 175 degrees C. The glass transition point of the epoxy resin is slightly higher than 175 degrees C. Therefore, with the epoxy resin sealing material, a long period is not maintained and the heat cycle does not reach 500 repetitions. Accordingly, for the heat cycle to reach 500 repetitions, some margin is necessary. As depicted in FIG. 2, by the addition of the maleimide resin powder, the glass transition point rises. Therefore, heat cycle property may be satisfied. Further, as another effect, it is thought that the maleimide powder further contributes to the adhesiveness of metal members such as the metal substrates. When the concentration of the maleimide resin powder is 0 to 50 weight %, the glass transition point gradually rises. When the concentration of the maleimide resin powder is 0 to 50 weight % or greater, the glass transition point sharply rises, becoming 198 degrees C. or higher, whereby the glass transition point is greater than 175 degrees C. and has a margin. Therefore, the concentration of the maleimide resin powder in the resin is preferable 5 weight % or greater. From 5 weight % to 50 weight %, although the glass transition point gradually rises, the heat cycle property may be satisfied. Further, the concentration of the maleimide resin powder in the resin is preferably 50 weight % or greater. This is because the glass transition point rises sharply, becoming 198 degrees C. or higher, whereby the glass transition point is greater than 175 degrees C. and has a margin.

The sealing resin for semiconductors is preferably non-combustible and has favorable workability. From examples 1 to 4, and 6 in FIG. 1, by setting the concentration of the maleimide resin powder in the resin to be 50 weight % or greater, the resin was found to become non-combustible. From examples 1 to 5 in FIG. 1, by setting the concentration of the maleimide resin powder in the resin to be 80 weight % or less, the resin was found to have favorable workability. Therefore, the concentration of the maleimide resin powder in the resin is preferably 50 weight % or greater and 80 weight % or less, which achieves non-combustibility and favorable workability.

Further, there is no limitation on the maleimide resin used in the present invention. However, when the wettability of the resin is good, the resin spreads uniformly on the surfaces of the components in the semiconductor package, filling the semiconductor package without gaps between members. Therefore, as a maleimide resin to be mixed in the sealing material, a mono maleimide resin for which wettability is high and adhesiveness is good is preferably used, and more preferably, a mono maleimide resin having a hydroxy group (hydroxyl (—OH)) is used. When the mono maleimide resin has a hydroxy group, the adhesiveness with the resin such as an epoxy resin also improves and the adhesiveness with metal members in the semiconductor package also improves.

As described, according to the embodiment, by mixing a maleimide resin powder with a resin having a glass transition point that is lower than that of the maleimide resin, the glass transition point of the resin rises and the heat resistance rises. Further, since the maleimide resin powder is already solid, curing is not necessary. As a result, the resin mixed with the maleimide resin powder may be cured at a lower temperature without having to perform curing processing at the curing temperature of the maleimide resin. Since curing is performed at a low temperature, the occurrence of voids in the resin and the formation of oxide films on the copper conductive plate of the substrate and on solder may be suppressed. The resin composite cured in this manner has a structure in which maleimide resin particles are dispersed in the matrix resin.

Further, since the epoxy resin is a resin having a glass transition point that is lower than that of the maleimide resin, by mixing the maleimide resin powder with the epoxy resin, a resin composite for which the heat resistance is improved and that is cured at a curing temperature that is about the same as that of the epoxy resin may be realized. Further, the resin obtained by mixing the maleimide resin powder with the epoxy resin may be cast molded and has no molding size limitations.

By mixing the maleimide resin powder to be 50 weight % or greater with respect to the epoxy resin, the resin may become non-combustible. Since a costly flame retardant for achieving non-combustibility is not necessary, low-cost manufacturing is enabled. Further, when the maleimide resin powder is mixed to be 80 weight % or less with respect to the epoxy resin, the workability becomes favorable.

By using a maleimide resin having a hydroxy group, the resin composite has high wettability and good adhesiveness. Therefore, the resin composite uniformly spreads on the surfaces of the components, filling in without gaps between members.

Further, use of the resin composite of the present invention in the thermosetting resin of the semiconductor device enables realization of a low-cost semiconductor device having high heat resistance and non-combustible properties, without limitations on molding size. Use of the resin composite of the present invention in the method of manufacturing a semiconductor device, enables manufacture of a low-cost semiconductor device without limitations on molding size. Further, the resin composite of the present invention has low viscosity, whereby workability during manufacture of the semiconductor device is enhanced.

In the description above, the invention is not limited to the embodiment described various modifications within a scope not deviating from the spirit of the invention are possible. For example, although the invention has been described taking, as an example, a semiconductor package in which metal wire electrically connects the semiconductor chip and metal terminal, and a thermosetting resin fills the inside of the case, the invention is further applicable to a semiconductor package having a pin structure electrically connecting, by a terminal pin, conductive layers of a circuit board and semiconductor chip arranged away from the conductive layers in a case.

Maleimide resin has a disadvantage in that a toxic nitrogen polar solvent has to be used since solubility in a solvent is low. In other words, maleimide resin is a material that is difficult to use in a liquid form. Further, although high-heat resistant resin such as maleimide resin has high heat resistance, the glass transition point Tg is also high. As a result, when melted and mixed, maleimide resin also has a high curing temperature. For example, the curing temperature of an epoxy resin is about 170 degrees C. whereas the curing temperature of maleimide resin and the like is about 200 degrees C. Since a mixed resin of a maleimide resin and an epoxy resin includes the maleimide resin, the curing temperature is that same as that of the maleimide resin, about 200 degrees C.

When curing is performed at a high temperature, acid anhydride and the like included in the sealing material as a curing agent contributes to the occurrence of voids, whereby the sealing material includes numerous voids. Further, oxide films easily form on the surfaces of the copper (Cu) conducting plates of the metal substrate and on solder contacting the sealing material. Consequent to these voids and oxide films, the adhesiveness of the sealing material and the solder and/or copper conducting plate of the substrate become poor and the reliability of the semiconductor device may decrease.

However, according to the invention described above, a maleimide resin powder is mixed with a resin having a glass transition point that is lower than that of the maleimide resin, whereby the glass transition point of the resin rises and the heat resistance rises. Further, since the maleimide resin powder is already solid, curing is not necessary. Thus, the resin mixed with the maleimide resin powder does not have to be cured at the curing temperature of the maleimide resin and may be cured at a lower temperature. Since the resin is cured at a low temperature, the occurrence of voids in the resin and the formation of oxide films on the copper conducting plate and solder may be suppressed.

The resin composite of the present invention achieves an effect of enabling a curing temperature about the same as that of the epoxy resin and an effect of enabling the heat resistance to be enhanced exceeding that of the epoxy resin.

As described, the resin composite, the semiconductor device, and the method of manufacturing a semiconductor device according to the present invention are useful for, for example, semiconductor devices used in power converting equipment such as converters and inverters, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A resin composite, comprising:
   a maleimide resin powder that has a particle size ranging from 10 to 200 μm and that comprises a melamine resin terminated by a hydrogen atom, a hydroxy group, or a hydrogen atom via an aromatic chromophore which is an unsubstituted divalent $C_6$-$C_{20}$ aryl or a substituted divalent $C_6$-$C_{20}$ aryl that is a substituted phenylene having a linear or branched $C_6$-$C_{20}$ alkyl substituent; and
   a resin having a glass transition point that is lower than that of the maleimide resin powder.

2. The resin composite according to claim 1, wherein the resin is an epoxy resin.

3. The resin composite according to claim 2, wherein the resin composite is cured at a curing temperature for the epoxy resin.

4. The resin composite according to claim 2, wherein the maleimide resin powder is mixed in an amount of 50 weight % to 80 weight % with respect to the epoxy resin.

5. The resin composite according to claim 1, wherein the maleimide resin powder is a maleimide resin having a hydroxy group.

6. A semiconductor device, comprising:
   a stacked substrate on which a semiconductor chip is mounted; and
   a thermosetting resin that surrounds the stacked substrate and is formed by a resin composite including a maleimide resin powder that has a particle size ranging from 10 to 200 μm and that comprises a melamine resin terminated by a hydrogen atom, a hydroxy group, or a hydrogen atom via an aromatic chromophore which is an unsubstituted divalent $C_6$-$C_{20}$ aryl or a substituted divalent $C_6$-$C_{20}$ aryl that is a substituted phenylene substituted with a linear or branched $C_6$-$C_{20}$ alkyl; and a resin having a glass transition point that is lower than that of the maleimide resin power.

7. The semiconductor device according to claim 6, wherein the resin is an epoxy resin, and the thermosetting resin is cured by curing the resin composite at a curing temperature for the epoxy resin.

8. A method of manufacturing a semiconductor device, comprising:
   mixing a maleimide resin powder that has a particle size ranging from 10 to 200 μm and that comprises a melamine resin terminated by a hydrogen atom, a hydroxy group, or a hydrogen atom via an aromatic chromophore which is an unsubstituted divalent $C_6$-$C_{20}$ aryl or a substituted divalent $C_6$-$C_{20}$ aryl that is a substituted phenylene substituted with a linear or branched $C_6$-$C_{20}$ alkyl; and a resin having a glass transition point that is lower than that of the maleimide resin powder to provide a resin mixture;
   surrounding a stacked substrate having a semiconductor chip mounted thereon with the resin mixture; and
   curing the resin mixture at a temperature of a glass transition point that is lower than that of the maleimide resin powder.

9. The method of manufacturing a semiconductor device according to claim 8, wherein the resin is an epoxy resin.

* * * * *